US009778325B2

(12) United States Patent
Motz

(10) Patent No.: US 9,778,325 B2
(45) Date of Patent: Oct. 3, 2017

(54) SENSOR WITH MICRO BREAK COMPENSATION

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 241 days.

(21) Appl. No.: 14/445,532

(22) Filed: Jul. 29, 2014

(65) Prior Publication Data

US 2016/0033585 A1 Feb. 4, 2016

(51) Int. Cl.
*G01R 33/02* (2006.01)
*G01R 33/00* (2006.01)

(52) U.S. Cl.
CPC ......... *G01R 33/0023* (2013.01); *G01R 33/02* (2013.01)

(58) Field of Classification Search
CPC .. G01R 33/02; G01R 33/022; G01R 33/0385; G01R 33/025; G01R 33/12; G01R 33/1223; G01R 31/31924; G01R 31/31922; G01R 31/31937; G01R 31/025; G01R 31/08; G01R 31/088; G01R 31/40; G01R 31/31721; G01R 1/28; G01R 17/105; G01R 19/10; G01N 27/72; G01N 27/02; G01P 3/66
USPC ..... 324/244, 239, 503, 522, 750.01, 764.01, 324/555, 602, 609, 178–179, 103 R, 98
See application file for complete search history.

(56) References Cited

U.S. PATENT DOCUMENTS

| 6,600,189 | B1 * | 7/2003 | Sato ................. H01L 27/1087 257/301 |
| 7,699,943 | B2 * | 4/2010 | Nakano ............... C21D 8/00 148/320 |
| 8,044,536 | B2 * | 10/2011 | Nguyen ............... H02J 1/08 307/32 |
| 2003/0137786 | A1 * | 7/2003 | Hasegawa ............ H02H 9/001 361/10 |
| 2004/0094779 | A1 * | 5/2004 | Isezaki ............ H03K 19/00361 257/202 |
| 2005/0194955 | A1 * | 9/2005 | Moran ............. H01L 31/02019 323/315 |
| 2006/0078773 | A1 * | 4/2006 | Speranza .......... H01M 8/04626 429/9 |
| 2009/0001926 | A1 * | 1/2009 | Sato ................. B60L 3/0046 320/102 |
| 2009/0057737 | A1 * | 3/2009 | Boescke .......... H01L 21/28291 257/295 |

(Continued)

FOREIGN PATENT DOCUMENTS

CN 201388161 Y 1/2010
CN 101706288 A 5/2010
(Continued)

*Primary Examiner* — Thang Le
(74) *Attorney, Agent, or Firm* — Eschweiler & Potashnik, LLC

(57) ABSTRACT

A sensor device includes a high voltage component, a sensor component and a charge storage component. The sensor component utilizes a low voltage supply. The high voltage component is configured to generate the low voltage supply from a high voltage supply. The charge storage component is configured to provide charge for the low voltage supply during a power break. The charge storage component has a vertical capacitor.

5 Claims, 6 Drawing Sheets

(56) References Cited

U.S. PATENT DOCUMENTS

| | | | |
|---|---|---|---|
| 2009/0164820 A1* | 6/2009 | Abraham | G06F 1/30 713/323 |
| 2009/0206960 A1* | 8/2009 | Ng | H01L 23/48 333/247 |
| 2010/0052424 A1* | 3/2010 | Taylor | H01L 23/5223 307/45 |
| 2010/0238598 A1* | 9/2010 | Liang | H03K 19/00315 361/56 |
| 2011/0169470 A1* | 7/2011 | Itakura | H02M 1/32 323/282 |
| 2011/0227416 A1* | 9/2011 | Lecourtier | H02J 9/061 307/66 |
| 2011/0231042 A1* | 9/2011 | Ueda | B60L 1/003 701/22 |
| 2012/0181854 A1* | 7/2012 | Gopalakrishnan | B60L 11/1861 307/9.1 |
| 2013/0147440 A1* | 6/2013 | Shiroyama | G01R 31/40 320/166 |
| 2013/0148747 A1* | 6/2013 | Puchiano | H04L 25/026 375/257 |
| 2013/0328401 A1* | 12/2013 | Chen | H02J 9/061 307/64 |

FOREIGN PATENT DOCUMENTS

| | | |
|---|---|---|
| CN | 101982919 A | 3/2011 |
| WO | 2010027658 A2 | 3/2010 |

* cited by examiner

SENSOR WITH MICRO BREAK COMPENSATION

BACKGROUND

Sensors are utilized in sensing systems to detect properties, such as light, temperature, motion, and the like. The sensors are typically configured to measure a property and then provide the measurement in a suitable form. For example, a sensor may measure a magnetic field and then provide the measurement as an output signal. The measurements are then used to calculate characteristics or results by a controller, such as an electronic control unit.

Sensors are supplied with power in order to properly operate and provide accurate measurements. If the supplied power breaks or deviates from a suitable range of voltage and/or current, erroneous measurements, no measurements, and the like can result.

Suitable mechanisms to compensate for power breaks and the like and to facilitate accurate measurements are needed.

DETAILED DESCRIPTION

Figure 1:
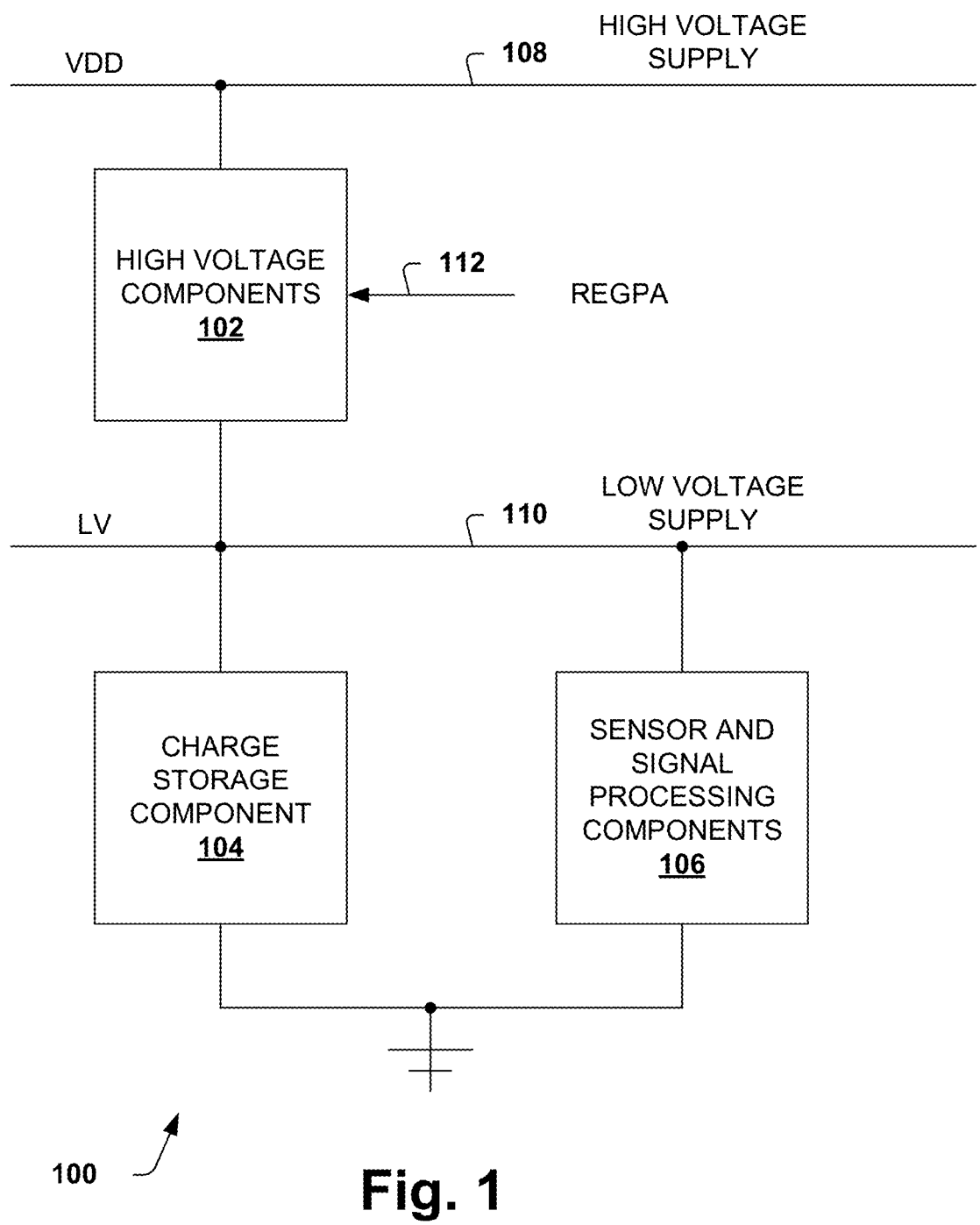
FIG. 1 is a diagram of a sensor system that compensates for power breaks.

The present invention will now be described with reference to the attached drawing figures, wherein like reference numerals are used to refer to like elements throughout, and wherein the illustrated structures and devices are not necessarily drawn to scale.

Devices, systems and methods are disclosed that compensate for power breaks in supply power to sensors and/or signal processing components. A power break is an interruption in supply power for a relatively short period of time.

FIG. 1 is a diagram of a sensor system 100 that compensates for power breaks. The system 100 is provided in a simplified form in order to facilitate understanding. The system 100 can be utilized in automotive systems, vehicle systems, and the like. The system 100 can be fabricated into one or more devices.

The system 100 includes high voltage components 102, a charge storage component 104 and sensor and signal processing components 106. The high voltage components 102 receive a high voltage supply 108 and provide a low voltage supply 110. The high voltage supply 108 is at a relatively high voltage, such as 12 volts, 20 volts and the like. In an automotive system, the high voltage supply 108 can be supplied by a battery device. In one example, the high voltage supply 108 is at a voltage of 8 or more volts. The low voltage supply 110 is provided at a level generally below the high voltage supply 108. The low voltage supply 110 is provided at a level suitable for the sensor and signal processing component 106. In one example, the low voltage supply 110 is provided at about 3 volts. In another example, the low voltage supply 110 is provided at 5 or less volts.

The high voltage components 102 include mechanisms to regulate the low voltage supply 110 and block reverse voltages from propagating to the high voltage supply 108. Typically, the components 102 include a high voltage reverse blocking component and a regulating device. The blocking component mitigates negative voltages, spikes, and the like from impacting the high voltage supply 108. Otherwise, the source of the high voltage supply 108 and/or other components connected thereto could be damaged or negatively impacted. In one example, the high voltage reverse blocking component is a PMOS transistor configured for blocking. In another example, the high voltage reverse blocking component is a blocking diode.

The regulating device of the components 102 regulates and generates the low voltage supply 110 according to a regulation input signal 112. In once example, the regulating device includes a power NMOS transistor. The regulation input signal 112 controls the level of the low voltage supply 110. Thus, the regulation input signal 112 can be varied throughout a range to select an output level for the low voltage supply 110 at a select level within a range of values. It is also appreciated that other suitable blocking components and regulating devices are contemplated. Some examples of suitable mechanisms are provided below.

The sensor and signal processing components 106 include one or more of sensors, control units, processing units, and the like. The components 106 require the low voltage supply 110 for proper operation. Power breaks, such as micro breaks, can cause the components 106 to fail, be unstable, provide inaccurate information, and the like.

The charge storage component 104 is configured to maintain the low voltage supply 110 at a suitable level during power breaks. The charge storage component 104 stores and maintains charge during non-break periods. The component 104 provides at least a portion of its stored charge during power breaks to compensate for deviations or drops in the low voltage supply 110. As a result, power breaks that alter the output of the high voltage components 102 are compensated for by the charge storage component 104.

The component 104 is configured to store a charge sufficient to compensate for a break in power for a selected time period. In one example, the charge storage component 104 includes one or more capacitors. The size and configuration of the capacitors are selected to mitigate cost and area consumption. For example, vertical capacitors, such as trench capacitors can be utilized. Vertical capacitors are capacitors that have electrodes and capacitor dielectric generally arranged vertically with respect to a horizontal substrate. Additionally, the capacitors can be low voltage capacitors as they operate with the low voltage supply 110.

Additionally, the charge storage component 104 is integrated with the high voltage components 102 and, optionally, other components into a single package. In contrast, other approaches require use of a large external capacitor in order to provide charge during breaks in power.

Figure 2:
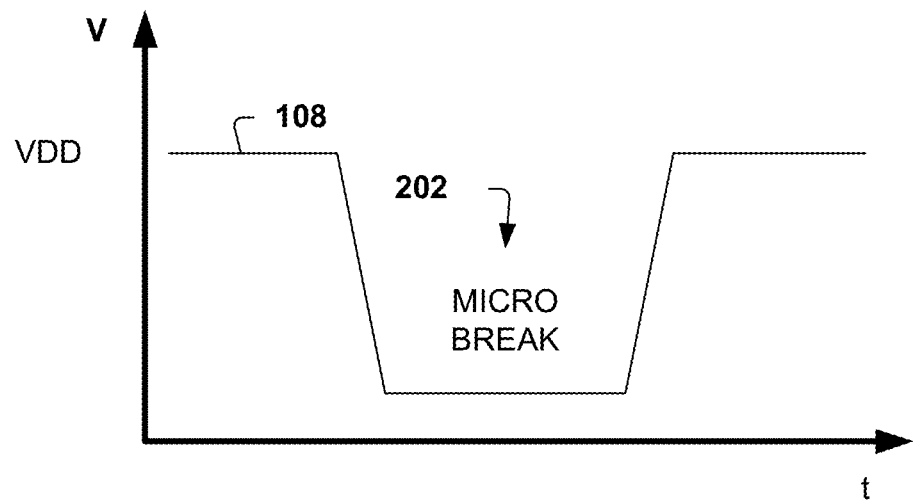
FIG. 2 is a graph illustrating power breaks that can occur in sensor systems.
Figure 2:
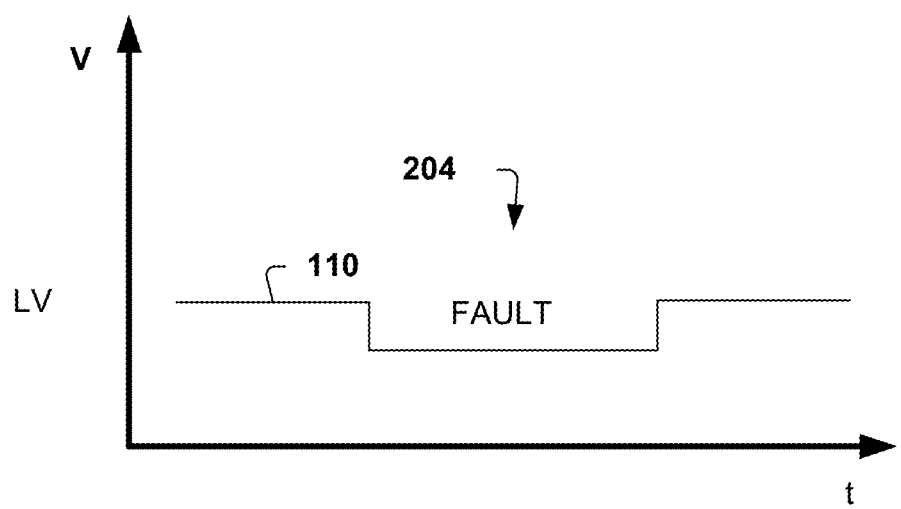

FIG. 2 is a graph 200 illustrating power breaks that can occur in sensor systems. The graph 200 includes an upper portion depicting the high voltage supply 108 and a lower portion depicting the low voltage supply 110. The graph 200 depicts time on an x-axis and volts on a y-axis.

The high voltage supply 108 is shown as a line in the upper portion. A power break, which in this example is a micro break, occurs at 202. A variety of potential events can cause the break, such as power source damage, temporary disconnection, magnetic fields, and the like. The micro break has a relatively short temporal duration, in the range of 1-100 micro seconds. In this example, the micro break 202 results in a drop of the high voltage supply 108. In other breaks, the voltage can turn negative, drop to zero, and the like.

The low voltage supply 110 is shown as a line in the lower portion. A potential fault 204 is shown at a time that corresponds with the micro break 202. The fault 204 results in a drop in voltage of the low voltage supply 110. Components, such as sensors, processing components, and the like that rely on the low voltage supply 110 can fail due to the fault 204.

However, utilizing a charge storage component, such as the component 104 described above, mitigates the impact of the fault 204 by providing at least a portion of its charge during the fault 204 and the micro break 202.

Figure 3:
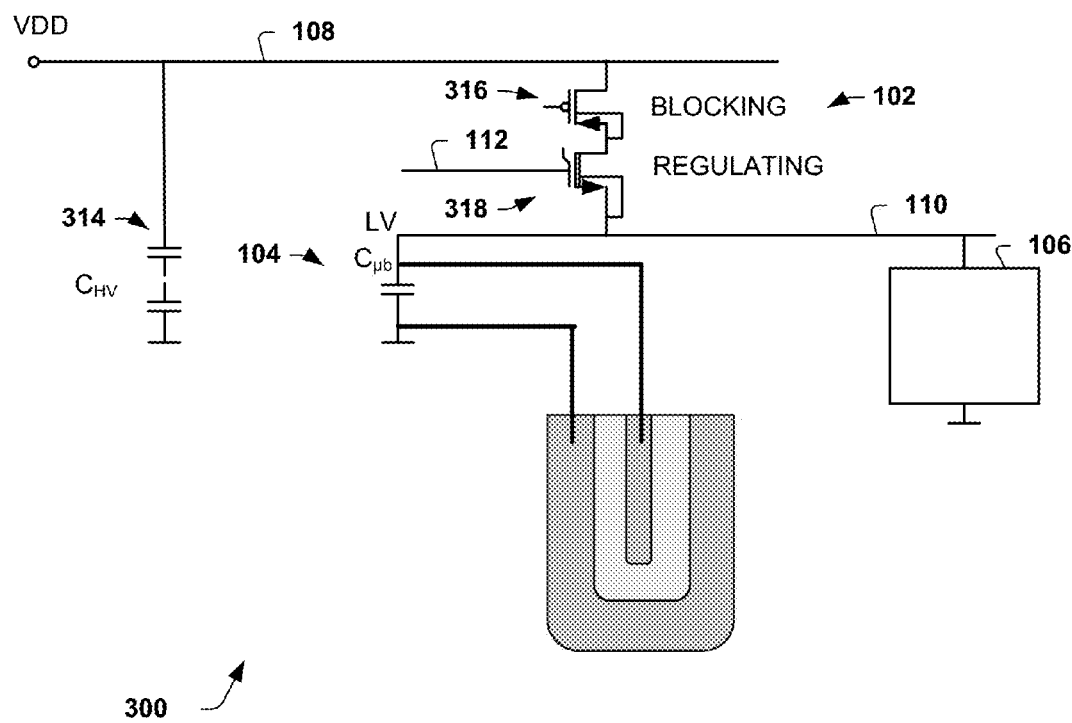
FIG. 3 is a diagram of a sensor system having a trench capacitor that compensates for power breaks.

FIG. 3 is a diagram of a sensor system 300 having a trench capacitor that compensates for power breaks. The system 300 can be utilized in automotive systems, vehicle systems, and the like. Additionally, the system 300 can be fabricated into one or more devices. The system 300 can be utilized with the system 100 described above. Additional description of like numbered components can be found above in the description of system 100.

The system 300 includes high voltage components 102, a charge storage component 104, sensor and signal processing components 106, and high voltage capacitors 314. The high voltage capacitors 314 filter unwanted signals/noise from the high voltage supply 108.

The high voltage capacitors 314 are configured or selected to accommodate a high voltage supply 108. The high voltage capacitors 314 include one or more capacitors. These capacitors can be formed on one or more dies, including a die on which the charge storage component 104 is formed on. Alternately, the capacitors 314 can be external capacitors that are physically separate from components such as the charge storage component 104. Some or all of the capacitors 314 are vertical or trench capacitors, whether internal or external. For example, at least some of the high voltage capacitors 314 may be arranged external to the component 104 due size and cost constraints. In another example, the high voltage capacitors 314 utilize a series of low voltage capacitors that can be formed/integrated with other components of the system 300. In one example, a plurality of vertical or trench capacitors are connected in serial to provide the high voltage filtering for the high voltage supply 108.

The high voltage supply 108 is at a relatively high voltage, such as 12 volts, 20 volts and the like. In an automotive system, the high voltage supply 108 can be supplied by a battery device. In one example, the high voltage supply 108 is at a voltage of 8 or more volts.

The high voltage components 102 receive the high voltage supply 108 and provide a low voltage supply 110. The low voltage supply 110 is provided at a level below the high voltage supply 108. Additionally, the low voltage supply 110 is provided at a level suitable for the sensor and signal processing component 106. In one example, the low voltage supply 110 is provided at about 3 volts. In another example, the low voltage supply 110 is provided at 5 or less volts.

The high voltage components 102 include mechanisms to regulate the low voltage supply 110 and block reverse voltages and the like from propagating to the high voltage supply 108. A blocking component 316 is coupled to the high voltage supply 108 and mitigates negative voltages, spikes, and the like from impacting the high voltage supply 108. Otherwise, the source of the high voltage supply 108 and/or other components connected thereto could be damaged or negatively impacted. In one example, the blocking component 316 is a PMOS transistor configured for blocking. In another example, the blocking component 316 is a blocking diode.

A power amplifier regulating device 318 is coupled to the blocking component 316 and the low voltage supply 110. The regulating device 318 generates the low voltage supply 110 according to a regulation input signal 112. In once example, the regulating device includes a power NMOS transistor. The regulation input signal 112 controls the level of the low voltage supply 110. Thus, the regulation input signal 112 is varied throughout a range to select an output level for the low voltage supply 110 at a select level within a range of values.

The sensor and signal processing components 106 include one or more of sensors, control units, processing units, and the like. The components 106 require the low voltage supply 110 for proper operation. Power breaks, such as micro breaks, can cause the components 106 to fail, be unstable, provide inaccurate information, and the like.

The charge storage component 104 is a trench capacitor in this example. The trench capacitor is a vertical capacitor. A cross sectional view of the component 104 is provided for illustrative purposes.

The trench capacitor 104 is configured to maintain the low voltage supply 110 at a suitable level during power breaks. During non-break periods, the capacitor 104 stores and maintains charge. During power breaks, the capacitor 104 provides at least a portion of its stored charge to compensate for deviations or drops in the low voltage supply 110. As a result, power breaks that alter the output of the high voltage components 102 are compensated for by the trench capacitor 104.

The trench capacitor 104 is compatible with low voltages and consumes a relatively small amount of area. As a result, the trench capacitor 104 can be provided with other the high voltage components 102 and, optionally, other components into a single package. In contrast, other approaches require use of a large external capacitor in order to provide charge during breaks in power.

Figure 4:
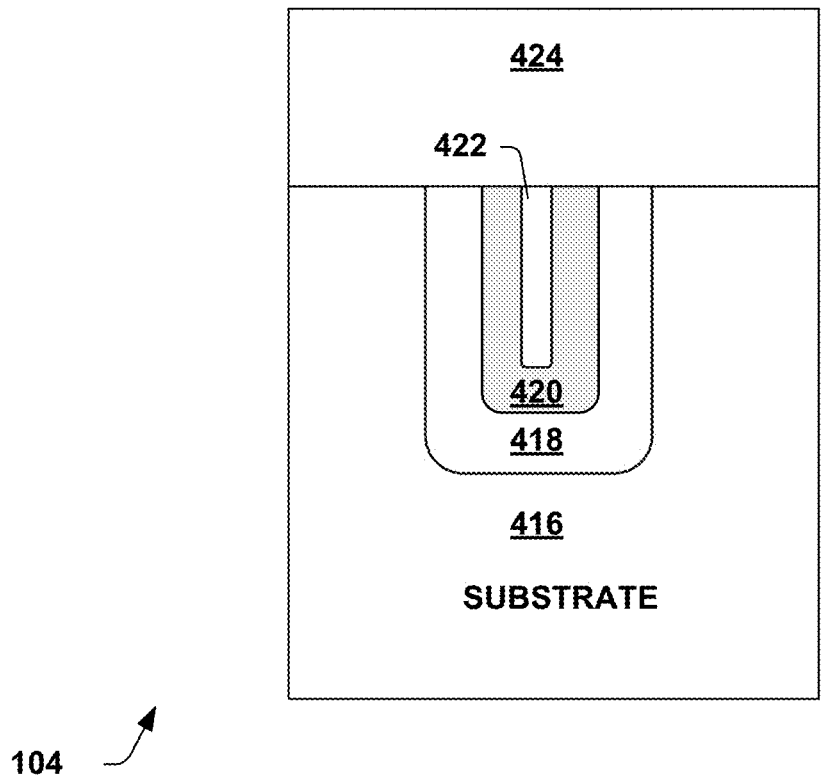
FIG. 4 is a cross sectional view of a vertical or trench capacitor.

FIG. 4 is a cross sectional view of a vertical or trench capacitor 104. The capacitor 104 serves as a charge storage component. The capacitor 104 is provided in a cross sectional view for illustrative purposes. It is appreciated that the dimensions and size ratios presented in FIG. 4 are for illustrative purposes only.

The capacitor 104 includes a substrate 416 comprised of a suitable semiconductor material, such as silicon. A trench is formed in the semiconductor material. A first vertical electrode 418 is formed within the trench of the substrate 416. The first electrode 418 is substantially vertical in its orientation. A capacitor dielectric layer 420 is formed on/over the first electrode 418. The layer 420 is also formed to be substantially vertical in its orientation. A second electrode 422 is formed in the dielectric layer 420. An upper layer 424 is formed over the other layers and serves to protect the underlying layers. The upper layer 424 includes and provides interconnects to the first electrode 418 and the second electrode 422.

It is appreciated that variations of the capacitor 104 are contemplated and that other capacitors and/or vertical capacitors can be utilized with the above systems and variations thereof.

Figure 5:
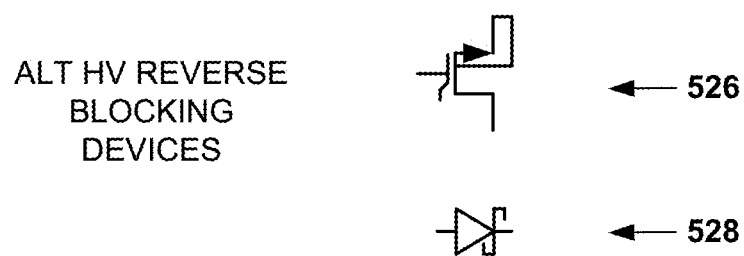
FIG. 5 is a diagram depicting examples of other suitable blocking components that can be used in the above systems.

FIG. 5 is a diagram depicting examples of other suitable blocking components that can be used in the above systems. A Schottky diode 528 can be used in one example. An anti-serial HVnMOS or HV-DMOS device 526 can also be used in another example. It is appreciated that other suitable blocking components can be used as well.

Figure 6:
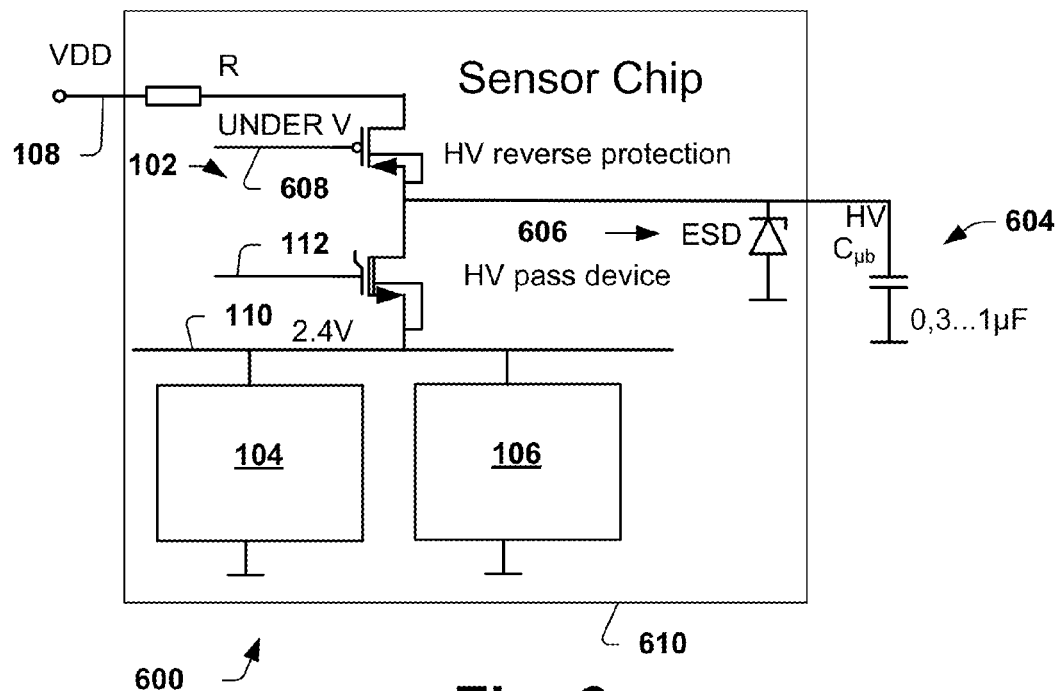
FIG. 6 is a diagram of a sensor system that compensates for power breaks at high voltage levels.

FIG. 6 is a diagram of a sensor system 600 that compensates for power breaks at high voltage levels. The system 600 is provided in a simplified form in order to facilitate understanding. The system 600 can be utilized in automotive systems, vehicle systems, and the like. The system 600 can be fabricated into one or more devices.

The system 600 includes high voltage components 102, a low voltage charge storage component 104, sensor and signal processing components 106, and a high voltage charge storage component 604. The system 600 is formed within a package or device 610, except the high voltage charge storage component 604 is external to the package 610.

The high voltage components 102 receive a high voltage supply 108 and provide a low voltage supply 110. The low voltage supply 110 is provided at a level suitable for the sensor and signal processing component 106. In one example, the low voltage supply 110 is provided at about 3 volts. In another example, the low voltage supply 110 is provided at 5 or less volts.

The high voltage components 102 include a reverse protection device that operates according to an under voltage signal 602. If the signal 602 indicates an under voltage condition, the reverse protection devices disconnects from the high voltage supply 108. There is also a resistor R connecting the reverse protection device to the high voltage supply 108, in this example.

The high voltage components 102 also include a regulation device that generates the low voltage supply 110. The regulation device receives a regulation control signal to select a low voltage level for the supply 110.

The high voltage components 102 are coupled to the high voltage charge storage component 604. The high voltage charge storage component 604 supplies mitigate power breaks and can provide at least a portion of its stored charge to the regulation device during a power break. The high voltage charge storage component 604 operates with higher voltages than the low voltage charge storage component 104. The high voltage charge storage component 604, in one example, uses one or more vertical capacitors, such as trench capacitors, to operate with the high voltage and maintain, store and supply charge for power breaks.

In one example, transistor drains of the reverse protection device and the regulation device are connected to the high voltage charge storage component 604. Additionally, an electrostatic discharge (ESD) protection device 606 can also be coupled to the high voltage components 102.

The low voltage charge storage component 104 is coupled to and the low voltage supply 110. As described above with regards to the charge component 104 of FIG. 1, the low voltage charge storage component 104 maintains, stores, and provides charge for power breaks, including micro breaks. It is appreciated that the low voltage charge storage component 104 can be omitted from the system 600.

The sensor and signal processing components 106, similar to those described above, include one or more of sensors, control units, processing units, and the like. The components 106 require the low voltage supply 110 for proper operation. Power breaks, such as micro breaks, can cause the components 106 to fail, be unstable, provide inaccurate information, and the like.

Figure 7:
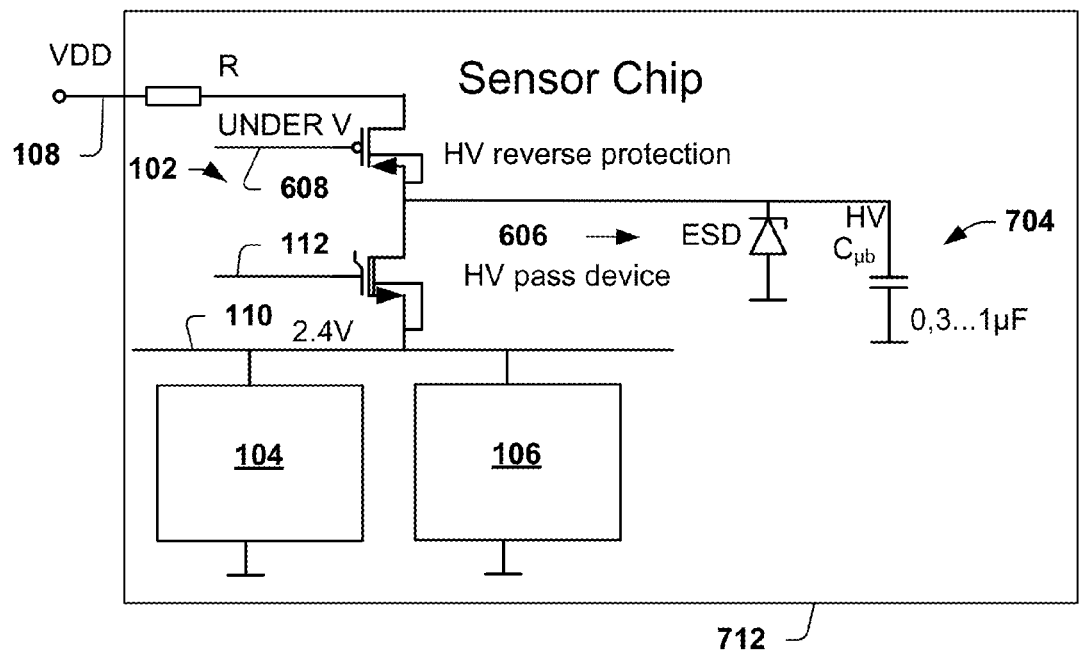
FIG. 7 is a diagram of a sensor system that compensates for power breaks at high voltage levels using an integrated high voltage charge storage component.

FIG. 7 is a diagram of a sensor system 700 that compensates for power breaks at high voltage levels using an integrated high voltage charge storage component. The system 700 is similar to the system 600 described above and its description can be referenced for additional details.

Instead of an external high voltage charge storage component 604, the system 700 uses an integrated high voltage charge storage component 704 within a package or device 712.

The high voltage charge storage component 704 includes one or more vertical capacitors. Typically, there are a plurality of capacitors that, collectively, operate with the high voltage levels.

It is appreciated that the high voltage storage components 604 and 704, and variations thereof can be integrated with the systems 100 and 300 described above.

Figure 8:
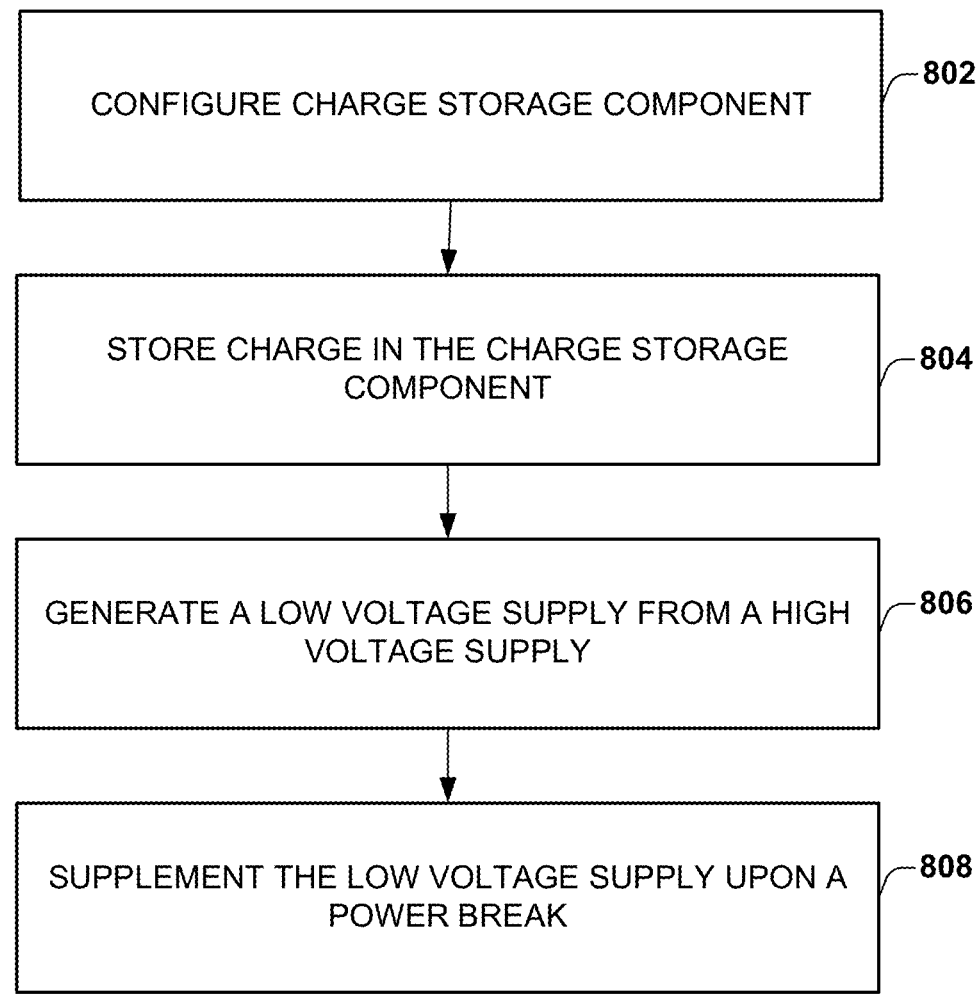
FIG. 8 is a flow diagram illustrating a method of operating a sensor device.

FIG. 8 is a flow diagram illustrating a method 800 of operating a sensor device. The method 800 utilizes a charge storage component to supplement a low voltage supply during power breaks. The method 800 can be used in conjunction with the above systems and variations thereof.

The method 800 begins at block 802, where a charge storage component is configured. The component is configured to have a selected charge storing capability and low voltage operation. The charge storing capability is selected to be sufficient to provide or supplement a low power supply for typical or expected power break durations. In some examples, the charge storage is selected to provide power for power break durations of 20 micro seconds.

The charge storage component is comprised of at least one vertical capacitor, such as a trench capacitor. Further, the component can include a plurality of vertical capacitors and/or a single vertical capacitor. In one example, the at least one capacitor is a trench capacitor having vertical electrodes and a vertical capacitor dielectric.

Charge is stored within the charge storage component during normal operation at block 804. Charge is provided to the component from a low voltage supply and/or a high voltage supply during normal operation or non power-break periods. Sufficient charge is stored to supplement or provide sufficient power as needed.

The low voltage supply is generated from a high level supply by a regulating device at block 806. A control signal can be used to select or adjust the low voltage supply. The high level supply is at a higher voltage level than the low voltage supply. In one example, the high level supply is above about 10 volts and the low level supply is below about 5 volts.

The low voltage supply is supplemented by the charge storage component upon a power break at block 808. Stored charge from the charge storage component is used to supplement or buffer the low voltage supply. The supply is brought to at least a threshold value/voltage that permits operation of components, such as sensor elements and processing components. The stored charge is typically sufficient for the temporal duration of the power break.

In one variation, the high voltage supply is supplemented by a high voltage charge storage component upon a power break. The high voltage charge storage component is configured to operate at a high voltage and to have sufficient charge storage capability. In one example, the high voltage charge storage component includes a plurality of capacitors, including vertical capacitors, which individually may not be high voltage capable.

In another variation, the high voltage supply is filtered using one or more high voltage capacitors. These capacitors filter the high voltage supply to remove unwanted noise and components. The capacitors can include one or more of low voltage capacitors and high voltage capacitors. Additionally, some or all of the capacitors can be formed on a die with the charge storage component. Further, some or all of the capacitors can be formed external to the charge storage component and/or the low voltage supply generating regulating device. Typically, the high voltage capacitors include vertical capacitors, such as trench capacitors.

As described above, the power break is a temporary reduction or loss of power provided. In one example, the power break is a micro break and occurs for a short period of time, such as 20 micro seconds or less.

While the method and variations thereof are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems/devices shown in FIGS. 1, 2, etc., are non-limiting examples of system that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A sensor device includes a high voltage component, a sensor component and a charge storage component. The sensor component utilizes a low voltage supply. The high voltage component is configured to generate the low voltage supply from a high voltage supply. The charge storage component is configured to provide charge for the low voltage supply during a power break. The charge storage component has a vertical capacitor.

In one example, the vertical capacitor is a trench capacitor formed in a horizontal substrate and having electrodes generally vertical. In another example, the vertical capacitor operates at low voltages of less than 5 volts. In yet another example, the charge storage component and the high voltage component are formed within a package. In another example, another sensor is configured to use the low voltage supply for operation.

A sensor device includes a high voltage reverse protection component, a regulating device, a high voltage charge storage component, and a sensor component. The high voltage reverse protection component is coupled to a high voltage supply and configured to isolate the high voltage supply upon an under voltage condition. The regulating device is coupled to the high voltage reverse protection component and configured to generate a low voltage supply from the high voltage supply. The high voltage charge storage component is coupled to the high voltage reverse protection component. The high voltage charge storage component is configured to provide a high voltage charge to the regulating device upon a power break. The sensor component is configured to operate using the low voltage supply during the power break.

A method of operating a sensor device is disclosed. A charge storage component is configured to have a selected charge storing capability and to operate at a low voltage. The charge storage component includes a vertical capacitor. Charge is stored in the charge storage component during normal operation. A low level supply is generated from a high level supply by a regulating device. The low level supply is supplemented by the charge storage component upon a power break.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sensor device comprising:
   a high voltage reverse protection component coupled to a high voltage supply and configured to isolate the high voltage supply upon an under voltage condition;
   a regulating device coupled to the high voltage reverse protection component and configured to generate a low voltage supply from the high voltage supply;
   a high voltage charge storage component coupled to the high voltage reverse protection component and configured to provide a high voltage charge to the regulating device upon a power break; and
   a sensor component configured to operate using the low voltage supply during the power break.

2. The device of claim 1, wherein the high voltage charge storage component includes a plurality of low voltage vertical capacitors.

3. The device of claim 1, wherein the high voltage charge storage component includes a trench capacitor.

4. The device of claim 1, further comprising a low voltage charge storage component configured to provide a low voltage charge to the sensor component upon the power break.

5. The device of claim 4, wherein the power break has a duration of less than 20 micro seconds.

* * * * *